(12) United States Patent
Takeuchi

(10) Patent No.: US 10,187,028 B2
(45) Date of Patent: Jan. 22, 2019

(54) LOW-PASS FILTER

(71) Applicant: TAIYO YUDEN CO., LTD., Tokyo (JP)

(72) Inventor: Hirotaka Takeuchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 16 days.

(21) Appl. No.: 15/472,588

(22) Filed: Mar. 29, 2017

(65) Prior Publication Data

US 2017/0288630 A1  Oct. 5, 2017

(30) Foreign Application Priority Data

Mar. 30, 2016 (JP) .................................. 2016-069699

(51) Int. Cl.
*H03H 7/01* (2006.01)
*H03H 1/00* (2006.01)

(52) U.S. Cl.
CPC ........ *H03H 7/0115* (2013.01); *H03H 7/1758* (2013.01); *H03H 7/1766* (2013.01); *H03H 2001/0085* (2013.01)

(58) Field of Classification Search
CPC ......... H03H 2001/0085; H03H 7/0115; H03H 7/1766; H03H 7/1758
USPC ................................................. 333/175, 185
See application file for complete search history.

(56) References Cited

U.S. PATENT DOCUMENTS

2009/0189714 A1  7/2009 Sakisaka et al.

FOREIGN PATENT DOCUMENTS

JP  2005-142689 A  6/2005
JP  2009-182377 A  8/2009

OTHER PUBLICATIONS

English translation of JP2005-142689; Kenmochi et al.; Feb. 6, 2005.*

* cited by examiner

*Primary Examiner* — Rakesh Patel
(74) *Attorney, Agent, or Firm* — Chen Yoshimura LLP

(57) ABSTRACT

In one aspect, the present disclosure provides a surface-mounted low-pass filter, including: a mounting surface having an input terminal electrode, an output terminal electrode, and a ground terminal electrode; a parallel resonant circuit between the input terminal electrode and the output terminal electrode; and a series resonant circuit between one end of the parallel resonant circuit and the ground terminal electrode, wherein the series resonant circuit has a first capacitor and a first inductor, and wherein, when the low-pass filter is viewed from above in a direction perpendicular to the mounting surface with the mounting surface on the bottom, the first inductor of the series resonant circuit is above the first capacitor.

5 Claims, 9 Drawing Sheets

LOW-PASS FILTER

BACKGROUND OF THE INVENTION

Technical Field

The present invention relates to a surface-mounted low-pass filter.

Background Art

In recent years, portable electronics have become increasingly smaller, yet the batteries, display devices, etc. embedded therein have become larger. Thus, there is demand for the high-frequency electronics that occupy the limited space in these devices to be even smaller. Accompanying this, there is a demand for surface mounted high-frequency electronic components such as LGAs, in order to decrease mounting area. Furthermore, the spread of carrier aggregation technology has increased the width and number of the frequencies in use. Therefore, there is demand for a low-pass filter that is small but still capable of adjusting the attenuation pole of the filter, and with low characteristic degradation.

In order to provide a high-frequency component having a low-pass filter that prevents interference as much as possible in a limited space and reduces degradation of electrical characteristics, Patent Document 1 discloses a high-frequency component including a parallel resonant circuit and a series resonant circuit, whereby line electrodes forming inductance elements in each of the resonant circuits do not overlap each other in the lamination direction. Patent Document 2, in order to increase the attenuation amount for a plurality of specific narrow frequency bands in the blocking bands of the low-pass filter, discloses a multilayer low-pass filter having a plurality of inductors provided in series between input/output terminals and a plurality of capacitors connected in parallel to the respective inductors, the multilayer low-pass filter being

RELATED ART DOCUMENTS

Patent Documents

Patent Document 1: Japanese Patent Application Laid-Open Publication No. 2005-142689
Patent Document 2: Japanese Patent Application Laid-Open Publication No. 2009-182377

SUMMARY OF THE INVENTION

To adjust high-frequency attenuation poles, it is necessary to control ground inductance, but in planar-mounted type components such as LGA structures, there are limits to increasing the pattern size of the inductor that connects to ground. This is due to the tendency for stray capacitance to increase when the input/output terminals and inductor pattern connected to ground are close to each other. In such a case, variations in manufacturing change the positional relationship with the input/output terminals of the inductor pattern that is connected to the ground pattern, which tends to also cause large changes in electrical characteristics. Moreover, increasing the size of the inductor pattern near ground tends to degrade the Q-factor, which could cause deterioration in loss characteristics. These concerns were less likely to be manifest in conventional technological components having side electrodes, such as that shown in FIG. 8 In FIG. 8, the component body has a multilayer structure that includes inductors L21 & L31 on top and capacitors C22, C32, C212, C12, and C312 on bottom; input/output terminal electrodes 41 and 42 extend to the sides. The reference character 99 represents stray capacitance.

In view of the above, the present invention aims at providing a surface-mounted low-pass filter capable of lowering stray capacitance and reducing a deterioration in loss characteristics. Accordingly, the present invention is directed to a scheme that substantially obviates one or more of the above-discussed and other problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a surface-mounted low-pass filter, including: a mounting surface having an input terminal electrode, an output terminal electrode, and a ground terminal electrode; a parallel resonant circuit between the input terminal electrode and the output terminal electrode; and a series resonant circuit between one end of the parallel resonant circuit and the ground terminal electrode, wherein the series resonant circuit has a first capacitor and a first inductor, and wherein, when the low-pass filter is viewed from above in a direction perpendicular to the mounting surface with the mounting surface on the bottom, the first inductor of the series resonant circuit is above the first capacitor.

According to at least some aspects of the present invention, it is possible to lower stray capacitance and reduce deterioration in loss characteristics in a surface-mounted low-pass filter. It is to be understood that both the foregoing general description and the following detailed description are exemplary and explanatory, and are intended to provide further explanation of the invention as claimed.

DETAILED DESCRIPTION OF EMBODIMENTS

Figure 1A:
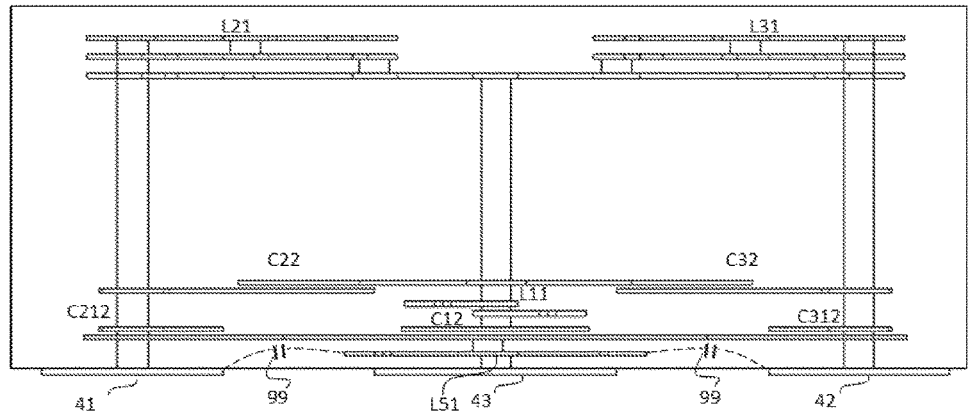
FIGS. 1A and 1B are schematic transmissive views of one example of a low-pass filter of the present invention.

The present invention will be described in detail below with reference to the drawings. The drawings are not intended to limit the scope of the present invention, but merely aim to illustrate an example. Directional terms such as "up" or "down" when referring to the drawings are merely explanatory and neither limit the manufacturing order nor limit the relationship between the vertical direction and mounting direction.

Figure 1B:
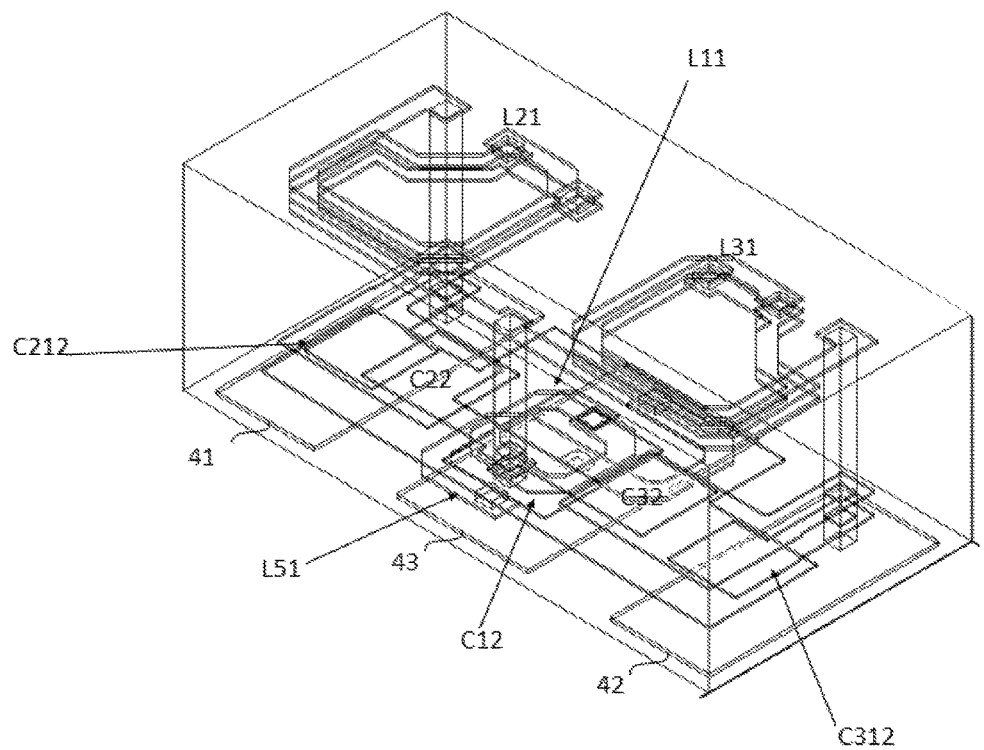

The low-pass filter of the present invention is a surface-mounted component, an example of which includes a component having only one mounting surface, and is typically a component with a so-called LGA structure. In the descriptions below, in regard to the directionality of the component, the mounting surface is defined as the "lower direction." FIGS. 1A and 1B are schematic transmissive views of one example of the low-pass filter of the present invention. FIG. 1A is a cross-sectional transmissive view, and FIG. 1B is a transmissive perspective view. In FIG. 1A, the mounting surface is the surface on the lower side of the paper sheet surface. LGA structure is an abbreviation for land grid array structure, which generally has planar electrode pads arranged next to one another on the mounting surface and is mounted by reflow soldering, sockets, or the like. The low-pass filter of the present invention includes at least the input terminal electrodes 41 and output terminal electrodes 42 and the ground terminal electrode 43.

Figure 2:
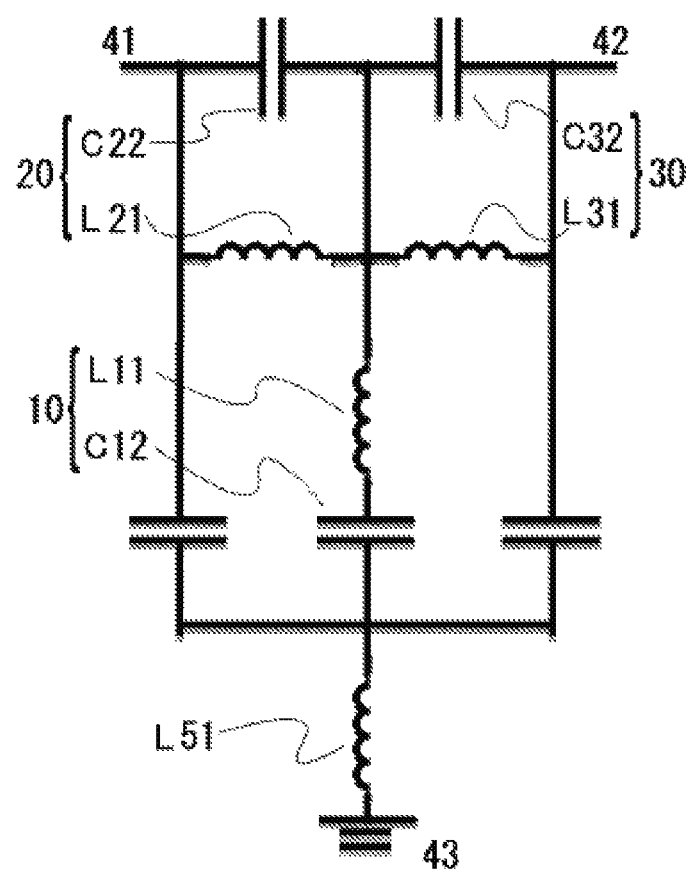
FIG. 2 is an equivalent circuit diagram of one example of a low-pass filter of the present invention.

FIG. 2 is an equivalent circuit diagram of one example of the low-pass filter of the present invention. The low-pass filter of the present invention includes a parallel resonant circuit 20 and a series resonant circuit 10. In the embodiment shown in FIG. 2, one additional parallel resonant circuit 30 is provided. The parallel resonant circuit 20 is provided between the input terminal electrode 41 and output terminal electrode 42. The series resonant circuit 10 is provided between one end of the parallel resonant circuit 20 and the ground terminal electrode 43.

The series resonant circuit 10 has a first inductor L11 and a first capacitor C12. The first capacitor C12 and first inductor L11 are connected in series. In the present invention, the first inductor L11 is formed above the first capacitor C12. As already described, the "above" in "formed above" refers to the "above" or "upper" direction when viewed in the direction perpendicular to the mounting surface with the mounting surface as the "below" or "lower" direction. When this is verified with the schematic transmissive views of FIGS. 1A and 1B, the ground terminal electrode 43 is on the lower side of the sheet surface, the first capacitor C12 is above the ground terminal electrode, and the first inductor L11 is above the first capacitor. There are no particular limitations to the positions of the inductor L21 and capacitor C22 forming the parallel resonant circuit, or the like.

Figure 3A:
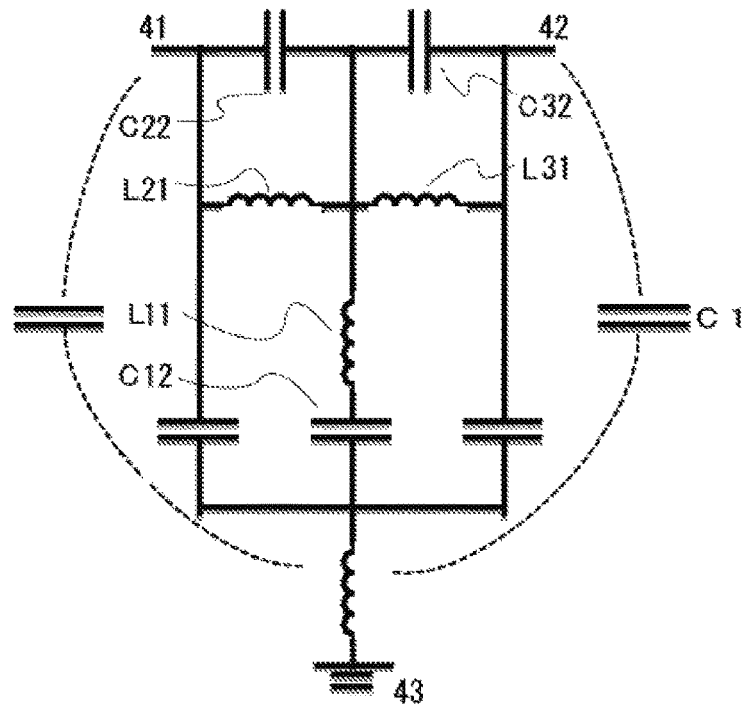
FIGS. 3A and 3B are diagrams for explaining stray capacitance in a low-pass filter of the present invention and conventional technology.
Figure 3B:
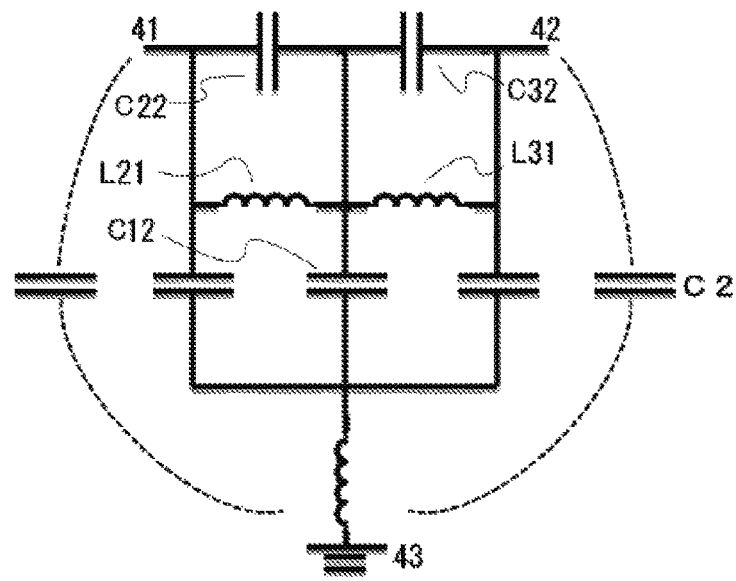
Figure 6:
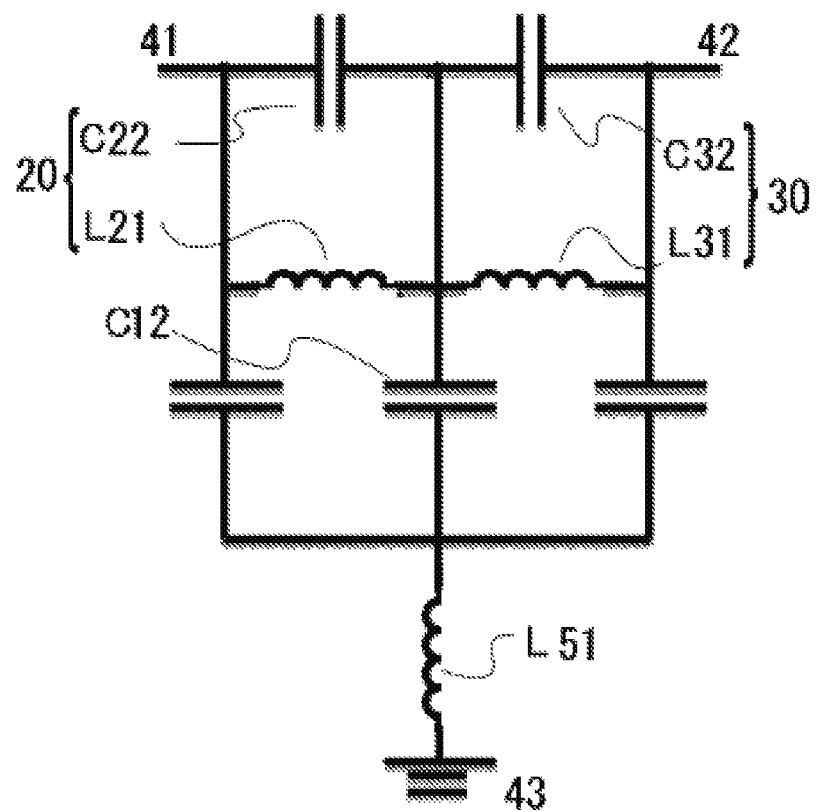
FIG. 6 is an equivalent circuit diagram for one example of a low-pass filter in conventional technology.
Figure 7:
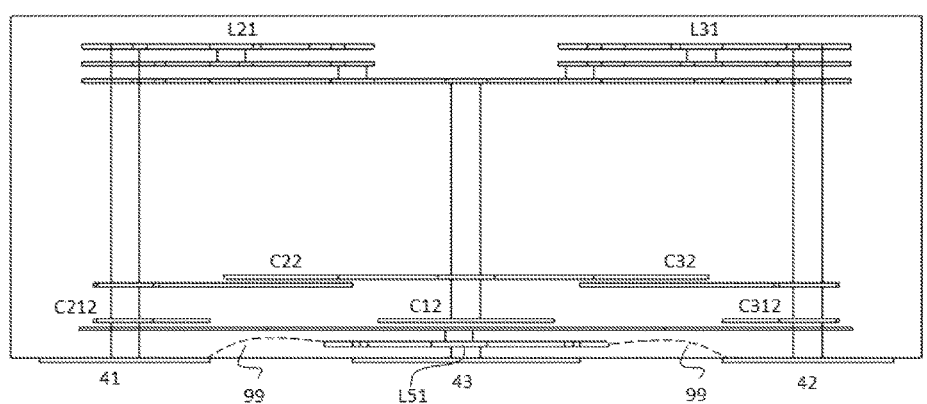
FIG. 7 is schematic transmissive view of one example of a low-pass filter in conventional technology.
Figure 8:
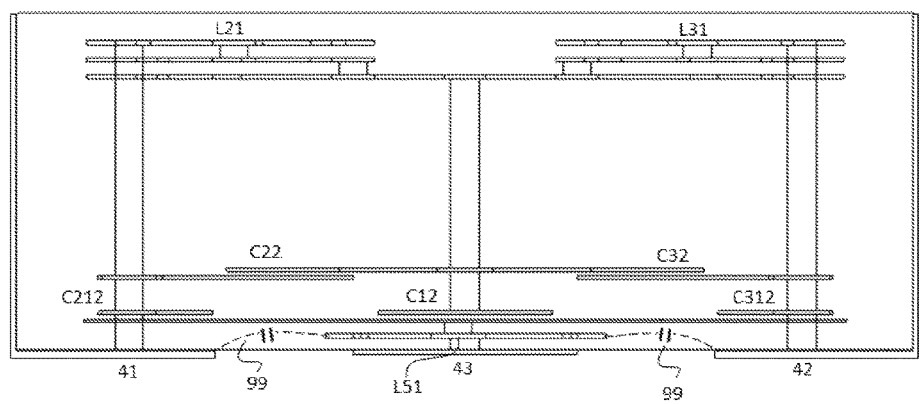
FIG. 8 is schematic transmissive view of one example of a low-pass filter in conventional technology.

In order to control ground inductance, ordinarily the inductance value of the inductor L51 would be increased, but when the inductor pattern size is increased in order to increase the inductance value of the inductor L51, there is a tendency for stray capacitance to increase as the input/output terminals and the inductor pattern become closer to each other. As described above, if ground inductance is controlled by adding the first inductor L11 instead of increasing the inductance value of the inductor L51, then the first inductor L11 is above the first capacitor C12, which can reduce stray capacitance more than if ground capacitance were to be controlled with only the inductor L51. The stray capacitance in the transmissive drawings is represented by the reference character 99 in FIG. 1A. FIGS. 3A and 3B will now be referred to in order to explain stray capacitance. FIGS. 3A and 3B are diagrams for explaining stray capacitance in a low-pass filter of the present invention and conventional technology. FIG. 3A shows the same circuit as the equivalent circuit diagram shown in FIG. 2. FIG. 3B shows a circuit without the first inductor L11 as one example of conventional technology. In FIGS. 3A and 3B, stray capacitance is represented by the dotted line. C1 and C2 are stray capacitance values. C1 is the stray capacitance of the low-pass filter based on the technical spirit of the present invention. C2 is the stray capacitance of the low-pass filter in one example of conventional technology. In this case, C1 is less than C2. This means that stray capacitance is smaller in the present invention. The circuit diagram of FIG. 6 is the circuit configuration shown in FIG. 3B but only showing the equivalent circuit diagram and not the supplementary explanation with the dotted lines; the schematic transmissive view of the low-pass filter in the circuit of FIG. 3B is shown in FIG. 7. The stray capacitance in FIG. 7 is also represented by the reference character 99.

As seen in FIGS. 1A and 1B and 2, the parallel resonant circuit 20 has the second inductor L21 and second capacitor C22. In a preferred embodiment, as shown in FIGS. 1A and 1B, the first inductor L11 not overlap the second inductor L21 in a perspective view of the low-pass filter in the direction perpendicular to the mounting surface. The direction perpendicular to the mounting surface is the up-and-down direction of the sheet for the schematic transmissive view of FIG. 1A. In this preferable embodiment, when the low-pass filter in FIG. 1A is viewed in the up-and-down direction of the sheet (i.e., in a plan view), the first inductor L11 does not overlap the second inductor L21. In FIG. 1A, the depth direction of the sheet is not depicted, and thus it is not clear whether the first inductor L11 and the second inductor L21 are overlapping. It is clear by referring to the transmissive perspective view of FIG. 1B, however, that the first inductor L11 does not overlap the second inductor L21.

In this manner, the first inductor L11 and the second inductor L21 not overlapping each other when the low-pass filter is viewed from above in the direction perpendicular to the mounting surface prevents positional variations from causing changes in the inductance values of the inductors L11 and L21 and the resulting frequency shift.

In the present invention, the parallel resonant circuit may be provided in a plurality. In the embodiment shown in FIG. 2, there are two parallel resonant circuits. Alternatively, in the present invention, there may be three or more parallel resonant circuits. These two parallel resonant circuits 20 and 30 are connected in series between input/output terminal electrodes 41 and 42. It is preferable that the series resonant circuit 10 be provided between this connection location and the ground terminal electrode 43. At such time, it is preferable, when the low-pass filter is viewed from above in the direction perpendicular to the mounting surface, that the first inductor L11 not overlap any of the inductors of the parallel resonant circuits. The meaning of the "direction perpendicular to the mounting surface" and "overlap when viewed" is as explained above. The absence of this type of overlap prevents positional variation from causing changes in the inductance values of the inductors and deviations in frequency.

In another preferred embodiment, the first inductor L11 does not overlap either the input terminal electrode 41 or output terminal electrode 42 when the low-pass filter is viewed from above in the direction perpendicular to the mounting surface (i.e., in a plan view). The meaning of the "direction perpendicular to the mounting surface" and "overlap when viewed" is as explained above. In the embodiment shown in the schematic transmissive views of FIGS. 1A and 1B, for example, the first inductor L11 has no overlap with the input/output terminal electrodes 41 and 42 when viewed from the direction perpendicular to the mounting surface. The absence of this type of overlap prevents positional variation from causing changes in the inductance values of the inductors and deviations in frequency.

Figure 4:
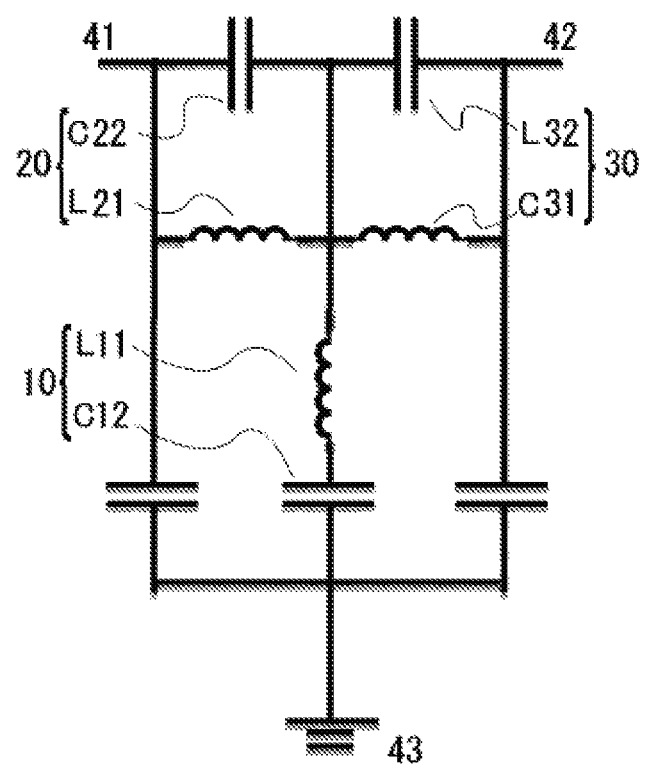
FIG. 4 is an equivalent circuit diagram of one example of a low-pass filter of the present invention.

The embodiment shown in FIG. 2 has an inductor L51 between the ground terminal electrode 43 and first capacitor C12, but this inductor L51 may alternatively be omitted. FIG. 4 is an equivalent circuit diagram of another embodiment of the low-pass filter of the present invention, and this low-pass filter does not have an inductor corresponding to the inductor L51 in FIG. 2.

Figure 5A:
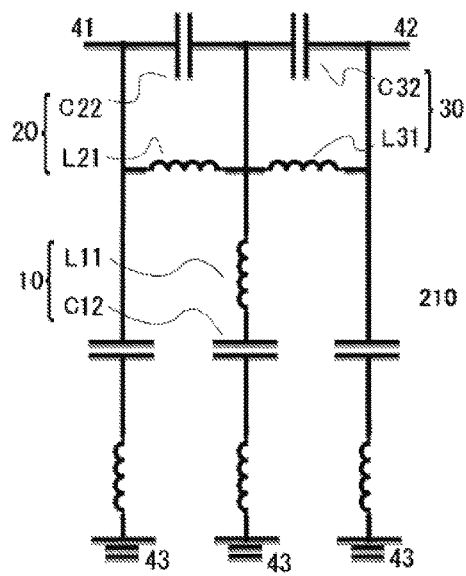
FIGS. 5A and 5B are equivalent circuit diagrams for two examples of a low-pass filter of the present invention.
Figure 5B:
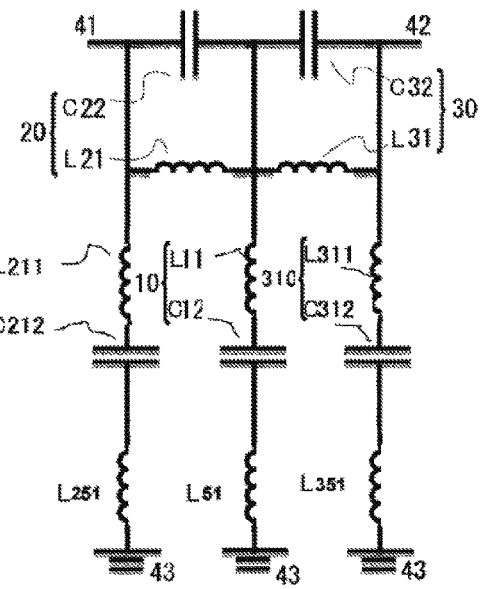

FIGS. 5A and 5B are equivalent circuit diagrams for two further embodiments of the present invention. In the low-pass filter of FIG. 5A, respective ends and the connection point of the two parallel resonant circuits 20 and 30 are connected to ground terminal electrodes 43, respectively, in an electrically independent manner, and there is only one series resonant circuit 10 having the first inductor L11 and first capacitor C12 as described above. Regardless of the number of parallel resonant circuits described above, there should be at least one series resonant circuit 10. In the low-pass filter shown in FIG. 5B, the respective ends and the connection point of the two parallel resonant circuits 20 and 30 are connected to the ground terminal electrodes 43, respectively, in an electrically independent manner, and the low-pass filter has the series resonant circuit 10 that includes the first inductor L11 and the first capacitor C12 described above, a series resonant circuit 210 that includes an inductor L211 and a capacitor C212, and a series resonant circuit 310 that includes an inductor L311 and a capacitor 312. In this manner, there may be a plurality of electrical paths that connect the respective ends of the parallel resonant circuit to the ground terminal electrode(s). Thus, a series resonant circuit 10 that satisfies the above-mentioned parameters may be provided only in the singular, as shown in FIG. 5A, or may be provided in a plurality, as shown in FIG. 5B. It is preferable that, if there are N number of parallel resonant circuits, that there be 1 to (N+1) number of series resonant circuits. Here, N is an integer greater than or equal to 1. For example, in the embodiments in FIGS. 5A and 5B, N is 2; in the embodiment in FIG. 5A there is only one series resonant circuit, and in the embodiment in FIG. 5B there is (N+1) series resonant circuits, or namely three.

The materials and methods of manufacturing the respective electrical elements of the low-pass filter of the present invention can reference conventional technology as appropriate. For example, the capacitor can be a ceramic dielectric material; the inductor can be made by printing conductive paste such as Ag or Cu into an electrode pattern; the entire low-pass filter can be formed by layering or sintering a plurality of green sheets together, etc. The ceramic dielectric material can be a material with Al, Si, Sr as a primary component and Ti, Bi, Cu, Mn, Na, K as a secondary component; a material with Al, Si, Sr as a primary component and Ca, Pb, Na, K as a secondary component; a material containing Al, Mg, Si, Gd; a material containing Al, Si, Zr, Mg, or the like, but is not particularly limited to these. In addition to a ceramic dielectric material, it is also possible to use a resin multilayer substrate, or a multilayer substrate made of a compound material in which resin and a ceramic dielectric powder have been mixed together. Alternatively, it is possible to have multiple insulating layers in which a resin and ceramic powder have been mixed or compounded.

Figure 9:
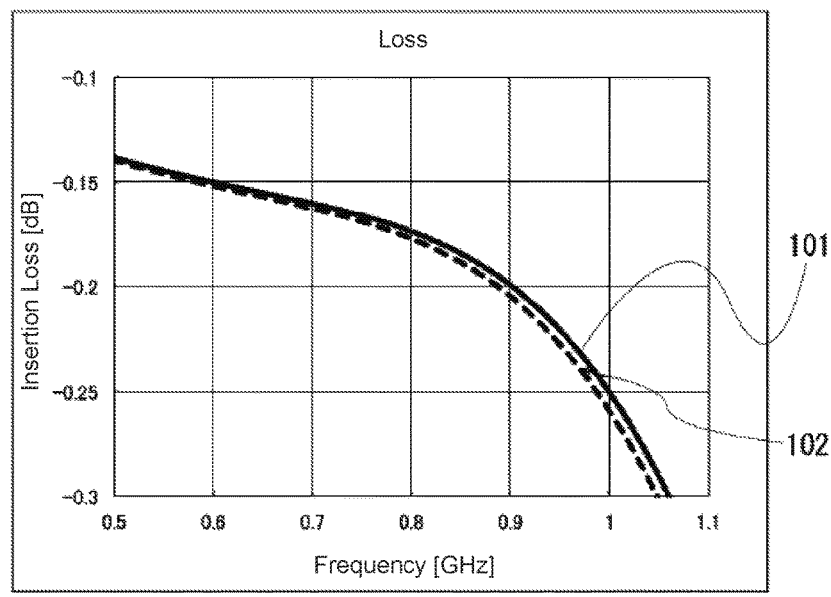
FIG. 9 is a diagram for explaining loss characteristics of a low-pass filter in the present invention and conventional technology.

The improvement effect in loss characteristics of the present invention will be explained with reference to FIG. 9. The vertical axis of the graph in FIG. 9 is insertion loss (loss characteristics) and the horizontal axis is frequency. The curve shown by the solid line is the low-pass filter of the present invention, and the curve shown by the dotted line is the low-pass filter of conventional technology. As can be seen at frequency 960 MHz, the value on the vertical axis for the curve of the solid line is 0.225 dB (reference character 101), and the value on the vertical axis for the dotted line is 0.233 dB (reference character 102). This signifies the following. Namely, that adding the inductor L11, rather than increasing the inductance value of the inductor L51, decreases total stray capacitance for the inductors L51 and L11, thereby increasing the Q factor (quality factor) of the inductors and improving insertion loss of the filter. This confirms improvements in loss characteristics with the low-pass filter of the present invention.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A surface-mounted low-pass filter, comprising:
   a mounting surface having an input terminal electrode, an output terminal electrode, and a ground terminal electrode;
   a parallel resonant circuit between the input terminal electrode and the output terminal electrode; and
   a series resonant circuit between one end of the parallel resonant circuit and the ground terminal electrode,
   wherein the series resonant circuit has a first capacitor and a first inductor,
   wherein, when the low-pass filter is viewed from above in a direction perpendicular to the mounting surface with the mounting surface on the bottom, the first inductor of the series resonant circuit is above the first capacitor
   wherein the parallel resonant circuit has a second capacitor and a second inductor, and
   wherein, when the low-pass filter is viewed from above in the direction perpendicular to the mounting surface, the first inductor of the series resonant circuit does not overlap the second inductor of the parallel resonant circuit.

2. The low-pass filter according to claim 1, wherein, when the low-pass filter is viewed from above in the direction perpendicular to the mounting surface, the first inductor does not overlap the input terminal electrode or the output terminal electrode.

3. A low-pass filter, comprising:
   a mounting surface having an input terminal electrode, an output terminal electrode, and a ground terminal electrode;
   a parallel resonant circuit between the input terminal electrode and the output terminal electrode; and
   a series resonant circuit between one end of the parallel resonant circuit and the ground terminal electrode,
   wherein the series resonant circuit has a first capacitor and a first inductor,
   wherein, when the low-pass filter is viewed from above in a direction perpendicular to the mounting surface with the mounting surface on the bottom, the first inductor of the series resonant circuit is above the first capacitor, and wherein two or more of the parallel resonant circuit are provided and connected in series between the input terminal electrode and the output terminal electrode, and the series resonant circuit is provided between the ground terminal electrode and a connection node at which two of said two or more parallel resonant circuits connect in series.

4. The low-pass filter according to claim 3, wherein the two or more parallel resonant circuits each have a capacitor and an inductor, and wherein, when the low-pass filter is viewed from above in the direction perpendicular to the mounting surface, the first inductor of the series resonant circuit does not overlap any of the inductors of the parallel resonant circuits.

5. A low-pass filter, comprising:

a mounting surface having an input terminal electrode, an output terminal electrode, and a ground terminal electrode;

a parallel resonant circuit between the input terminal electrode and the output terminal electrode; and a series resonant circuit between one end of the parallel resonant circuit and the ground terminal electrode, wherein the series resonant circuit has a first capacitor and a first inductor, wherein, when the low-pass filter is viewed from above in a direction perpendicular to the mounting surface with the mounting surface on the bottom, the first inductor of the series resonant circuit is above the first capacitor, and wherein N number of said parallel resonant circuit is provided and connected in series between the input terminal electrode and the output terminal electrode, and 1 to (N+1) number of said series resonant circuit is provided and each connected between said ground terminal or a separate ground terminal and one end of one of the (N+1) series resonance circuits, where N is an integer greater than or equal to 1.

* * * * *